(12) United States Patent
Shin et al.

(10) Patent No.: US 9,544,999 B2
(45) Date of Patent: Jan. 10, 2017

(54) TRANSPARENT ELECTRODES AND ELECTRONIC DEVICES INCLUDING THE SAME

(71) Applicant: SAMSUNG ELECTRONICS CO., LTD., Suwon-si, Gyeonggi-do (KR)

(72) Inventors: Weonho Shin, Seocho-gu (KR); Yun Sung Woo, Yongin-si (KR); Daejin Yang, Yeongju-si (KR); Jinyoung Hwang, Incheon-si (KR); Chan Kwak, Gyeonggi-do (KR); Hyeon Cheol Park, Hwaseong-si (KR); Jae-Young Choi, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/918,711

(22) Filed: Oct. 21, 2015

(65) Prior Publication Data

US 2016/0192483 A1 Jun. 30, 2016

(30) Foreign Application Priority Data

Dec. 24, 2014 (KR) ........................ 10-2014-0188949

(51) Int. Cl.
*H05K 1/00* (2006.01)
*H05K 1/09* (2006.01)
*B82Y 30/00* (2011.01)

(52) U.S. Cl.
CPC ........ *H05K 1/09* (2013.01); *B82Y 30/00* (2013.01)

(58) Field of Classification Search
CPC .......... H05K 1/09; H05K 1/092; H05K 1/095; H05K 1/097; B82Y 30/00

USPC ................................................. 174/257, 268
See application file for complete search history.

(56) References Cited

U.S. PATENT DOCUMENTS

| 5,995,359 A | 11/1999 | Klee et al. |
| 7,585,349 B2 | 9/2009 | Xia et al. |
| 2009/0129004 A1* | 5/2009 | Gruner .............. H01L 31/02246 361/679.21 |

(Continued)

FOREIGN PATENT DOCUMENTS

| EP | 2547735 | 1/2013 |
| JP | 2007230208 A | 9/2007 |

(Continued)

OTHER PUBLICATIONS

Li et al., "Highly Bendable, Conductive, and Transparent Film by an Enhanced Adhesion of Silver Nanowires", American Chemical Society, Applied Materials, vol. 5, 2013, pp. 9155-9160.

(Continued)

*Primary Examiner* — Hoa C Nguyen
(74) *Attorney, Agent, or Firm* — Cantor Colburn LLP

(57) ABSTRACT

A transparent electrode includes: a substrate; an electrically conductive layer disposed on the substrate and including a plurality of nano-sized conductors; and an organic/inorganic composite layer directly disposed on the electrically conductive layer and including a cross-linked polymer and nano-sized inorganic oxide particles, wherein the nano-sized inorganic oxide particles are included in an amount of greater than or equal to about 1 part by weight and less than about 35 parts by weight, relative to 100 parts by weight of the cross-linked polymer. Also an electronic device including the same.

18 Claims, 13 Drawing Sheets

(56) References Cited

U.S. PATENT DOCUMENTS

| | | | |
|---|---|---|---|
| 2009/0203164 A1* | 8/2009 | Kang | H01G 9/2004 438/82 |
| 2009/0252967 A1 | 10/2009 | Yoon et al. | |
| 2010/0200286 A1 | 8/2010 | Melcher et al. | |
| 2012/0032900 A1 | 2/2012 | Itoh et al. | |
| 2012/0153236 A1 | 6/2012 | Cakmak et al. | |
| 2012/0300168 A1 | 11/2012 | Hoke | |
| 2012/0328829 A1* | 12/2012 | Vang | B82Y 20/00 428/141 |
| 2013/0004765 A1 | 1/2013 | Zou et al. | |
| 2014/0252342 A1* | 9/2014 | Ramadas | H01L 21/56 257/40 |
| 2014/0262453 A1* | 9/2014 | Poon | H05K 3/12 174/253 |
| 2014/0290992 A1* | 10/2014 | Hur | G06F 3/044 174/257 |
| 2015/0027755 A1* | 1/2015 | Tsujimoto | B82Y 30/00 174/253 |
| 2015/0075596 A1* | 3/2015 | Lim | G06F 3/041 136/256 |
| 2015/0118508 A1* | 4/2015 | Shin | H01B 1/22 428/457 |

FOREIGN PATENT DOCUMENTS

| | | |
|---|---|---|
| JP | 201449245 A | 3/2014 |
| KR | 1020090105761 A | 10/2009 |
| KR | 1020130107460 A | 10/2013 |
| WO | 2011115603 A1 | 9/2011 |

OTHER PUBLICATIONS

Moon et al., "2D Graphene Oxide Nanosheets as an Adhesive Over-Coating Layer for Flexible Transparent Conductive Electrodes", Nature, Scientific Reports, vol. 3, 1112, 2012, pp. 1-7.

Morgenstern et al., "Ag-nanowire films coated with ZnO nanoparticles as a transparent electrode for solar cells", Applied Physics Letters, vol. 99, 2011, pp. 183307-1-183307-3.

\* cited by examiner

TRANSPARENT ELECTRODES AND ELECTRONIC DEVICES INCLUDING THE SAME

CROSS REFERENCE TO RELATED APPLICATION

This application claims priority to and the benefit of Korean Patent Application No. 10-2014-0188949, filed in the Korean Intellectual Property Office on Dec. 24, 2014, and all the benefits accruing therefrom under 35 U.S.C. §119, the entire content of which is incorporated herein by reference.

BACKGROUND

1. Field

Transparent electrodes and electronic devices including the same are disclosed.

2. Description of the Related Art

An electronic device, such as a flat panel display such as an LCD or LED, a touch screen panel, a solar cell, a transparent transistor, and the like may include a transparent electrode. The transparent electrode is desirably made of a material having high light transmittance (e.g., greater than or equal to about 70%) for 380 to 780 nm wavelength light, and having a low sheet resistance of, for example, less than or equal to 100 ohm/sq, or less than or equal to 50 ohm/sq, even if made in a thin film.

A currently used material for a transparent electrode is indium tin oxide (ITO). ITO has sufficient transmittance in a full visible light range, but has sheet resistance of greater than or equal to 100 ohm/sq at room temperature. In addition, the ITO will inevitably cost more due to limited reserves of indium, and it is not appropriate for an electrode for a flexible display due to its brittleness. Accordingly, development of a material for a flexible transparent electrode having high transmittance and low sheet resistance is desired.

SUMMARY

An embodiment provides a flexible transparent electrode having high electrical conductivity and excellent light transmittance.

Another embodiment provides an electronic device including the transparent electrode.

In an embodiment, a transparent electrode includes: a substrate;

an electrically conductive layer disposed on the substrate and including a plurality of nano-sized conductors; and an organic/inorganic composite layer directly disposed on the electrically conductive layer and including a cross-linked polymer and nano-sized inorganic oxide particles, wherein the nano-sized inorganic oxide particles are included in an amount of greater than or equal to about 1 part by weight and less than about 35 parts by weight, relative to 100 parts by weight of the cross-linked polymer.

The electrically conductive layer may include a discontinuous layer where two or more of the nano-sized conductors contact each other to provide an electrical connection.

The nano-sized conductors may include an electrically conductive metal nanowire, an electrically conductive metal nanosheet, an electrically conductive metal nanomesh, an electrically conductive carbon nanotube, or a combination thereof.

The electrically conductive layer may include an organic binder for binding the plurality of nano-sized conductors.

The nano-sized inorganic oxide particles may have a size of less than about 50 nanometers (nm).

The nano-sized inorganic oxide particles may include $SiO_2$, $Al_2O_3$, $TiO_2$, ZnO, $ZrO_2$, $Y_2O_3$, or a combination thereof.

The cross-linked polymer may include an acrylate cross-linking bond.

The cross-linked polymer may include a cross-linking polymerization product of urethane (meth)acrylate, a perfluoropolymer including a (meth)acrylate group, a poly (meth)acrylate including a (meth)acrylate group, epoxy (meth)acrylate, or a combination thereof.

At least a portion of the nano-sized inorganic oxide particles may be dispersed in a matrix of the cross-linked polymer.

The electrically conductive layer and the organic/inorganic composite layer may provide an integrated structure.

At least a portion of the nano-sized inorganic oxide particles may be disposed in gaps between nano-sized conductors of the plurality of nano-sized conductors.

The integrated structure may have a thickness of greater than about 80 nm and less than about 150 nm.

The nano-sized inorganic oxide particles may be included in an amount of greater than or equal to about 5 parts by weight and less than or equal to about 25 parts by weight, relative to 100 parts by weight of the cross-linked polymer.

The organic/inorganic composite layer may have surface roughness of less than or equal to about 5 nm.

The transparent electrode may have haze of less than or equal to about 1 percent (%) and transmittance of greater than or equal to about 88% for light having a wavelength of 550 nm.

The transparent electrode may have sheet resistance of less than or equal to about 30 ohms per square (ohm/sq).

In another embodiment, an electronic device including the transparent electrode is provided.

The electronic device may be a flat or curved display, a touch screen panel, a solar cell, an e-window, an electrochromic mirror, a transparent heater, a heat mirror, a transparent strain sensor, a transparent transistor, or a flexible display.

The transparent electrode according to an embodiment may have high light transmittance, low haze, and a low sheet resistance. Further, the transparent electrode may have improved flexibility. In addition, the transparent electrode may resist diffusion of moisture and air therethrough, thus, it may provide improved long-term reliability. The transparent electrode may be applied to provide a touch screen panel or a display for any of a variety of electronic devices such as a smart phone, a tablet PC, a wearable device, or E-paper, for example.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The above and other aspects, advantages and features of this disclosure will become more apparent by describing in further detail exemplary embodiments thereof with reference to the accompanying drawings, in which.

DETAILED DESCRIPTION

Figure 1:
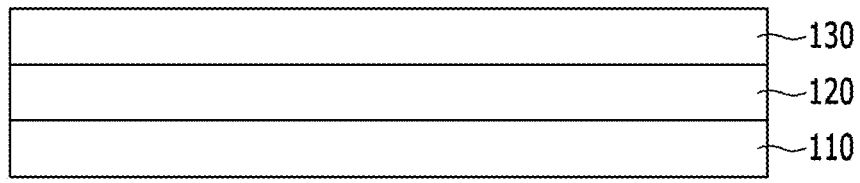
FIG. 1 is a schematic view showing an embodiment of a structure of a transparent electrode.

Exemplary embodiments will now be described more fully with reference to the accompanying drawings, in which some exemplary embodiments are shown. The exemplary embodiments, may, however, be embodied in many different forms and should not be construed as being limited to the embodiments set forth herein; rather, these exemplary embodiments are provided so that this disclosure will be thorough and complete, and will fully convey the scope of the inventive concepts to those of ordinary skill in the art. Therefore, in some embodiments, known process technologies may not be explained in detail in order to avoid unnecessarily obscuring aspects of the embodiments. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising" will be understood to imply the inclusion of stated elements but not the exclusion of any other elements.

Further, the singular includes the plural unless mentioned otherwise.

In the drawings, the thickness of layers, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer," or "section" discussed below could be termed a second element, component, region, layer, or section without departing from the teachings herein.

"Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations.

"Nano-sized" means about 1 nm to about 100 nm.

A transparent electrode according to an embodiment, and as shown schematically in FIG. 1, includes:

a substrate 110;

an electrically conductive layer 120 disposed on the substrate and including a plurality of nano-sized conductors; and an organic/inorganic composite protective layer 130 directly disposed on the electrically conductive layer, wherein the organic/inorganic composite protective layer includes a cross-linked polymer and nano-sized inorganic oxide particles. The nano-sized inorganic oxide particles are included in an amount of greater than or equal to about 1 part by weight (e.g., greater than or equal to about 2 parts by weight, greater than or equal to about 3 parts by weight, or greater than or equal to about 4 parts by weight) and less than about 35 parts by weight (e.g., less than or equal to about 30 parts by weight), relative to 100 parts by weight of the cross-linked polymer.

The substrate may be a transparent substrate. The substrate material is not particularly limited, and it may be a glass substrate, a semiconductor substrate, a polymer substrate, or a combination thereof, and it may be a substrate in which an insulation film and/or an electrically conductive film are/is disposed thereon, e.g., stacked thereon. As non-limiting examples, the substrate may include an inorganic material such as glass, a polyester such as polyethylene terephthalate, polybutylene terephthalate, and polyethylene naphthalate, a polycarbonate, an acryl-based resin, a cellulose or a derivative thereof, a polymer such as a polyimide, an organic/inorganic hybrid material, or a combination thereof. The thickness of the substrate is also not particularly limited, and may be appropriately selected depending upon the type of the final product. For example, the substrate may have a thickness of greater than or equal to about 0.5 micrometer (µm), for example greater than or equal to about 1 µm, or greater than or equal to about 10 µm, and is not limited thereto. The substrate may have a thickness of less than or equal to about 1 millimeter (mm), for example less than or equal to about 500 µm, or less than or equal to about 200 µm, but is not limited thereto.

An additional layer (e.g. undercoat) may be provided between the substrate and the electrically conductive layer, if desired (e.g., for controlling a refractive index).

An electrically conductive layer including a plurality of nano-sized conductors is disposed on a substrate. The terms "nano-sized conductors" refers to a conductor having a nanometer-order thickness or a nanometer-order diameter, e.g., a thickness and/or diameter of about 1 nm to about 100 nm, about 2 nm to about 75 nm, or about, about 2 nm to about 75 nm, or about 4 nm to about 50 nm. The electrically conductive layer may include a discontinuous layer wherein two or more of the nano-sized conductors contact each other to provide an electrical connection. Accordingly, the electrically conductive layer may include gaps between adjacent nano-sized conductors.

In an embodiment, the nano-sized conductors may comprise an electrically conductive metal nanowire, an electrically conductive nanosheet, an electrically conductive metal nanomesh, an electrically conductive carbon nanotube, or a combination thereof.

The electrically conductive metal nanowire may have a diameter of less than or equal to about 50 nm, for example less than or equal to about 40 nm, or less than or equal to about 30 nm. The length of electrically conductive metal nanowire is not particularly limited, and may be appropriately selected according to the diameter. For example, the electrically conductive metal nanowire may have a length of greater than or equal to about 1 µm, greater than or equal to about 2 µm, greater than or equal to about 3 µm, greater than or equal to about 4 µm, or greater than or equal to about 5 µm, and is not limited thereto. According to another embodiment, the electrically conductive metal nanowire may have a length of greater than or equal to about 10 µm, for example greater than or equal to about 11 µm, greater than or equal to about 12 µm, greater than or equal to about 13 µm, greater than or equal to about 14 µm, or greater than or equal to about 15 µm. In an embodiment, the electrically conductive metal nanowire may have a length of about 1 µm to about 15 µm, or about 2 µm to about 10 µm. The electrically conductive metal nanowire may include silver (Ag), copper (Cu), gold (Au), aluminum (Al), cobalt (Co), palladium (Pd), or a combination thereof (e.g., an alloy thereof, or a nanometal wire having two or more segments, each segment independently comprising silver (Ag), copper (Cu), gold (Au), aluminum (Al), cobalt (Co), palladium (Pd), or a combination thereof). The electrically conductive metal nanowire may be fabricated according to the disclosed method, or may be commercially available. The nanowire may include a polymeric coating, such as a coating comprising polyvinylpyrrolidone, on the surface of the electrically conductive metal nanowire.

The electrically conductive nanosheet may include a ceramic sheet having a nanometer-order thickness or a metal sheet having a nanometer-order thickness. The sheet may have a lateral size of greater than or equal to about 0.1 µm, for example greater than or equal to about 1 µm, but is not limited thereto, and the lateral size may be about 0.1 µm to about 100 µm. The electrically conductive nanosheet may be fabricated according to any suitable disclosed method and may be commercially available. For example, the electrically conductivity ceramic nanosheet (nanoflake) may be fabricated in accordance with the method disclosed in WO 2003041183 or WO 2002095841 A2, or a similar method, for example, the contents of which are incorporated herein by reference in their entirety.

The metal nanomesh comprises a metal and has a nano-sized network structure. The network structure may have a thickness of less than or equal to about 1 um, but is not limited thereto, and may be about 0.001 µm to about 1 µm. The method of manufacturing an electrically conductive metal nanomesh may be as disclosed in KR10-1328483, the content of which is incorporated herein by reference in its entirety.

The electrically conductive carbon nanotube is a type of carbon allotrope having a cylindrical nanostructure. The electrically conductive carbon nanotube may be fabricated according to any suitable method and may be commercially available.

The electrically conductive layer may include an organic binder for binding the plurality of nano-sized conductors (e.g., nanowires). The binder may have a role to appropriately control the viscosity of composition for forming an electrically conductive layer or to enhance the binding force of the nano-sized conductors on the substrate. Non-limiting examples of the binder may include methyl cellulose, ethyl cellulose, hydroxypropyl methyl cellulose (HPMC), hydroxypropyl cellulose (HPC), xanthan gum, polyvinyl alcohol (PVA), polyvinyl pyrrolidone (PVP), carboxyl methyl cellulose, hydroxyl ethyl cellulose, or a combination thereof. The amounts of binder may be appropriately selected, and is not particularly limited. As the non-limiting example, the binder amount may range from about 1 to about 100 parts by weight, based on 100 parts by weight of the nano-sized conductors.

The electrically conductive layer may be disposed, e.g., formed, on the substrate. For example, the electrically conductive layer may be formed by applying the coating composition including the nano-sized conductors (e.g., nanowires) on the substrate and removing a solvent. The coating composition including nano-sized conductors may further include an appropriate solvent (e.g., water, an organic solvent which is miscible with water, such as ethanol, or is non-miscible with water such at toluene, or the like) and a dispersing agent, which are disclosed. For example, the ink composition including nanowire may be commercially available. The obtained composition is coated on a substrate and dried and/or heat treated to provide an electrically conductive layer. The composition may be coated according to various methods, for example, bar coating, blade coating, slot die coating, spray coating, spin coating, gravure coating, inkjet printing, or a combination thereof.

The transparent electrode according to an embodiment may have an organic/inorganic composite layer directly disposed on the electrically conductive layer. The organic/inorganic composite protective layer includes a cross-linked polymer and nano-sized inorganic oxide particles. The organic/inorganic composite protective layer acts as a protective layer 130 for protecting the electrically conductive layer 120 as shown in FIG. 1, to prevent or minimize damage to the electrically conductive layer caused by a mechanical contact and also to not give substantial influence on the overall optical properties and electrical properties of both the electrically conductive layer and the transparent electrode.

As demand for a flexible transparent electrode increases, attempts have been made to use nano-sized conductors such as graphene, carbon nanotubes, metal mesh, metal nanowire, and the like as a conductive material for a transparent electrode. However, unlike indium tin oxide (ITO), the nano-sized conductors are susceptible to damage by extraneous forces such as mechanical friction and chemical abrasion. In order to solve the problems, a polymer-based protective layer on the electrically conductive layer surface including nano-sized conductors has been attempted. However, the polymer protective layer may easily have an unfavorable influence on the optical properties (e.g., transparency and haze) and the properties of the electrical conductivity of a transparent electrode including nano-sized conductors. In addition, it is difficult for the polymer protective layer to effectively protect nano-sized conductors under a high temperature and high humidity atmosphere.

On the contrary, the organic/inorganic composite protective layer 130 may effectively protect the electrically conductive layer 120 including the nano-sized conductors from exterior damage such as mechanical friction, and also may maintain the optical properties and the electrical conductivity of the electrically conductive layer as it was or may improve the same. In addition, the organic/inorganic composite protective layer 130 may enhance the reliability of a transparent electrode even under a high temperature and high humidity atmosphere. In addition, the organic/inorganic composite protective layer 130 may improve the folding endurance of a transparent electrode.

Without being bound to specific theory, the inorganic nanoparticles included in the organic/inorganic composite protective layer are understood to reside in gaps between conductors, which may be present on the conductive layer and may suppress polymer shrinkage when curing a resin for forming a protective layer, thus the surface roughness of the electrically conductive layer may be decreased. The decrease of the surface roughness may improve the transmittance of the electrode and also decrease haze. In addition, as the diffusion (transmission) path of a gas or moisture may be extended in the electrode by inorganic nanoparticles, the organic/inorganic composite protective layer may have lower gas transmittance, so the reliability may be improved under the high temperature and high humidity atmosphere. For example, in the case that the transparent electrode includes silver nanowire, the air and moisture permeating inside the electrode may cause oxidization and sulfurization of silver nanowire, so as to remarkably increase the resistance of the entire electrode. The organic/inorganic composite protective layer including the inorganic oxide nanoparticles can be uniformly dispersed in the cross-linked polymer matrix, and the inorganic oxide nanoparticles may extend the pathway for diffusing air and moisture, so that the composite layer may provide lower transmittance of air and/or moisture. Accordingly, the transparent electrode including the organic/inorganic composite protective layer may prevent the deterioration of the nanowire caused by air and moisture, so it may provide significantly improved long-term reliability.

According to an embodiment, the nano-sized inorganic oxide particles may have a size of less than about 50 nm, for example less than or equal to about 40 nm, less than or equal to about 30 nm, or less than or equal to about 25 nm, and may have a size of about 1 nm to about 50 nm. When the inorganic oxide particles in the organic/inorganic composite protective layer have the disclosed size, the transmittance of the electrode may be improved, and also the haze thereof may be decreased. The nano-sized inorganic oxide particles may include $SiO_2$, $Al_2O_3$, $TiO_2$, $ZnO$, $ZrO_2$, $Y_2O_3$, or a combination thereof. The inorganic oxide particles may undergo surface treatment to enhance the affinity for the polymer. The nano-sized inorganic oxide particles may be non-porous particles.

The cross-linked polymer may include an acrylate cross-linking bond. The cross-linked polymer may include a cross-linking polymerization product of urethane (meth)acrylate, a perfluoropolymer including a (meth)acrylate group, a poly(meth)acrylate including a (meth)acrylate group, an epoxy(meth)acrylate, or a combination thereof. The cross-linking polymerization product may be a photo-cured polymer. The polymer may be synthesized according to any suitable method and may be commercially available from various providers. According to an embodiment, the polymer may include urethane acrylate. At least one part of the nano-sized inorganic oxide particles may be dispersed, for example, may be uniformly dispersed in the matrix of the cross-linked polymer.

Figure 2:
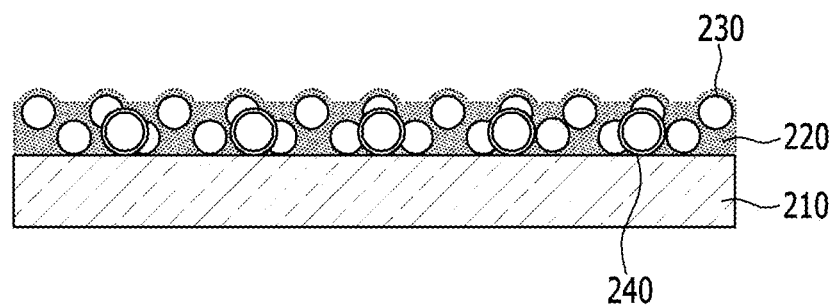
FIG. 2 is a schematic view showing a cross-section of an embodiment of a transparent electrode.

In an embodiment, the electrically conductive layer and the organic/inorganic composite protective layer may provide an integrated structure as shown in FIG. 2. Accordingly, the electrically conductive layer and the organic/inorganic composite protective layer may form a single layer without a distinguishable boundary. In this case, at least one part of the nano-sized inorganic oxide particles 230, which are disposed in the cross-linked polymer matrix 220 and on the substrate 210, may be disposed in gaps between nano-sized conductors 240 of the plurality of nano-sized conductors. The thickness of the integrated structure or the sum of thicknesses of the electrically conductive layer and the organic/inorganic composite layer may be greater than about 80 nm and less than about 150 nm.

As is further described above, in the organic/inorganic composite protective layer, the amounts of nano-sized inorganic oxide particles may be greater than or equal to about 1 part by weight, for example greater than or equal to about 2 parts by weight, greater than or equal to about 3 parts by weight, greater than or equal to about 4 parts by weight, greater than or equal to about 5 parts by weight, greater than or equal to about 9 parts by weight, or greater than or equal to about 10 parts by weight based on 100 parts by weight of the cross-linked polymer. In addition, the amount of nano-sized inorganic oxide particles may be less than about 35 parts by weight, for example less than or equal to about 34 parts by weight, less than or equal to about 33 parts by weight, less than or equal to about 32 parts by weight, less than or equal to about 31 parts by weight, less than or equal to about 30 parts by weight, less than or equal to about 25 parts by weight, or less than or equal to about 20 parts by weight. Within the range, the organic composite protective layer may have further lower surface roughness, and may have increased transmittance of the transparent electrode while decreasing the haze thereof. According to an embodiment, the organic/inorganic composite protective layer may have a surface roughness of less than about 10 nm, for example less than or equal to about 7 nm, less than or equal to about 6 nm, or less than or equal to about 5 nm, or about 1 nm to about 10 nm. The optical properties may be improved by the low surface roughness of the organic/inorganic composite layer. For example, the transparent electrode may have haze of less than or equal to about 1% and transmittance of greater than or equal to about 88% for light having a wavelength of about 550 nm.

The organic/inorganic composite layer does not have a substantially unfavorable influence on the electrical conductivity of the electrically conductive layer directly underneath. In order to provide a flexible conductive thin film having high electrical conductivity, various trials have been performed to use an electrically conductive metal nanowire (e.g., silver nanowire). In order to provide a desirable level of sheet resistance, the amount of silver nanowire is to be increased, but with a high amount of silver nanowire it is difficult to provide light transmittance as high as demanded since the metal has a reflective characteristic. For example, it is difficult for the electrically conductive layer including the metal nanowire to have both the low sheet resistance and the high light transmittance (low haze) at the same time since the sheet resistance and the light transmittance have a trade-off relationship. However, the transparent electrode according to an embodiment may improve the optical properties (i.e., transmittance and haze) without substantial loss of electrical conductivity due to the organic composite layer disposed directly on the electrically conductive layer. For example, the transparent electrode may have sheet resistance of less than or equal to about 50 ohms per square (ohm/sq), for example, less than or equal to about 40 ohm/sq, or about 1 ohm/sq to 50 ohm/sq at 1 percent (%) haze when measured by a turbidity meter (haze meter), and transmittance of greater than or equal to about 90% for the full visible light range (e.g., 380 nm-780 nm).

According to an embodiment, the forming an organic/inorganic composite protective layer may be performed in accordance with the following methods. A composition including a precursor of the cross-linking polymer (e.g., a polymer including a polymerizable acrylate group, for example, urethane (meth)acrylate, a perfluoropolymer including a (meth)acrylate group, a poly(meth)acrylate including a (meth)acrylate group, an epoxy(meth)acrylate, and the like), the inorganic oxide nanoparticle, and selectively a solvent, a dispersing agent, a photoinitiator, or the like is prepared. The prepared composition is coated on the electrically conductive layer according to an appropriate method. The coating method is the same as described for the electrically conductive layer. The coated composition is selectively dried and polymerized for the cross-linking to provide an organic/inorganic composite protective layer. As described above, the organic/inorganic composite protective layer may form an integrated structure with the electrically conductive layer.

The transparent electrode may be applied to an electronic device such as a flat or curved display, a touch screen panel, a solar cell, an e-window, an electrochromic mirror, a transparent heater, a heat mirror, a transparent strain sensor, a transparent transistor, or a flexible display. The transparent electrode may be used as a functional glass or an anti-static layer. In particular, the transparent electrode may be used for a flexible electronic device due to excellent flexibility.

Hereinafter, the electronic device, for example an organic light emitting diode device including the transparent electrode, is described referring to the drawings.

In the drawings, the thickness of layers, films, panels, regions, etc., are exaggerated for clarity. Like reference numerals designate like elements. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 12:
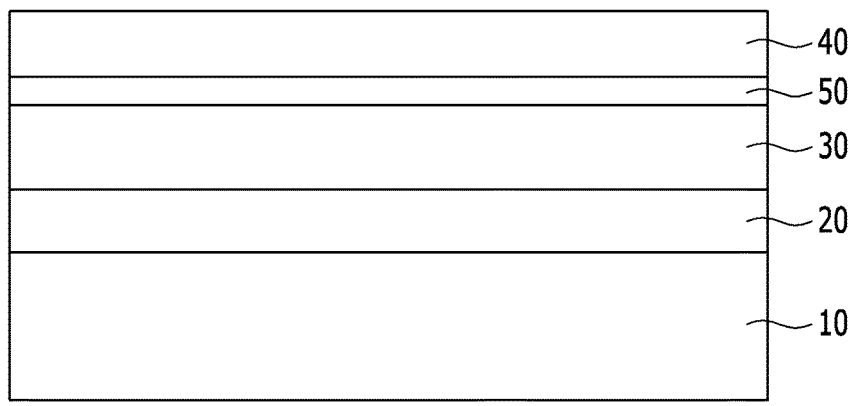
FIG. 12 is a schematic cross-sectional view of an embodiment of an organic light emitting diode device (OLED) including a transparent electrode.

FIG. 12 is a schematic cross-sectional view of an organic light emitting diode device according to an embodiment.

Referring to FIG. 12, an organic light emitting diode device according to an embodiment includes a substrate 10, a lower electrode 20, an upper electrode 40 facing the lower electrode 20, and an emission layer 30 interposed between the lower electrode 20 and the upper electrode 40.

The substrate 10 may include, for example, an inorganic material such as glass or an organic material such as polycarbonate, polymethylmethacrylate, polyethylene terephthalate, polyethylene naphthalate, polyamide, polyethersulfone, or a combination thereof, a silicon wafer, and the like.

One of the lower electrode 20 and the upper electrode 40 is a cathode and the other is an anode. For example, the lower electrode 20 may be an anode and the upper electrode 40 may be a cathode.

At least either one of the lower electrode 20 and the upper electrode 40 is transparent. When the lower electrode 20 is transparent, an organic light emitting diode device may have bottom emission in which light is emitted toward the substrate 10, while when the upper electrode 40 is transparent, the organic light emitting diode device may have top emission in which light is emitted opposite the substrate 10. In addition, when the lower electrode 20 and upper electrode 40 are both transparent, light may be emitted both toward the substrate 10 and opposite the substrate 10.

The transparent electrode may comprise a product of the aqueous composition. The emission layer 30 may comprise an organic material emitting one light among primary colors such as red, green, blue, and the like, or a mixture of an inorganic material with the organic material, for example, a polyfluorene derivative, a poly(paraphenylene vinylene) derivative, a polyphenylene derivative, a polyfluorene derivative, polyvinylcarbazole, a polythiophene derivative, or a compound prepared by doping these polymer materials with a perylene-based pigment, a coumarin-based pigment, a rothermine-based pigment, rubrene, perylene, 9,10-diphenylanthracene, tetraphenyl butadiene, Nile red, coumarin, quinacridone, and the like. An organic light emitting diode device displays a desirable image by a spatial combination of primary colors emitted by an emission layer therein.

The emission layer 30 may emit white light by combining three primary colors such as red, green, and blue. Specifically, the emission layer 30 may emit white light by combining colors of neighboring sub-pixels or by combining laminated colors in a vertical direction.

An auxiliary layer 50 may be positioned between the emission layer 30 and the upper electrode 40 to improve luminous efficiency. In the drawing, the auxiliary layer 50 is shown only between the emission layer 30 and the upper electrode 40, but is not limited thereto, and may be positioned between and emission layer 30 and the lower electrode 20, or may be positioned between the emission layer 30 and the upper electrode 40 and between the emission layer 30 and the lower electrode 20.

The auxiliary layer 50 may include an electron transport layer (ETL) and a hole transport layer (HTL) for balancing between electrons and holes, an electron injection layer (EIL) and a hole injection layer (HIL) for reinforcing injection of electrons and holes, and the like. It may include one or more layers selected therefrom. The auxiliary layer 50 may be omitted.

Figure 13:
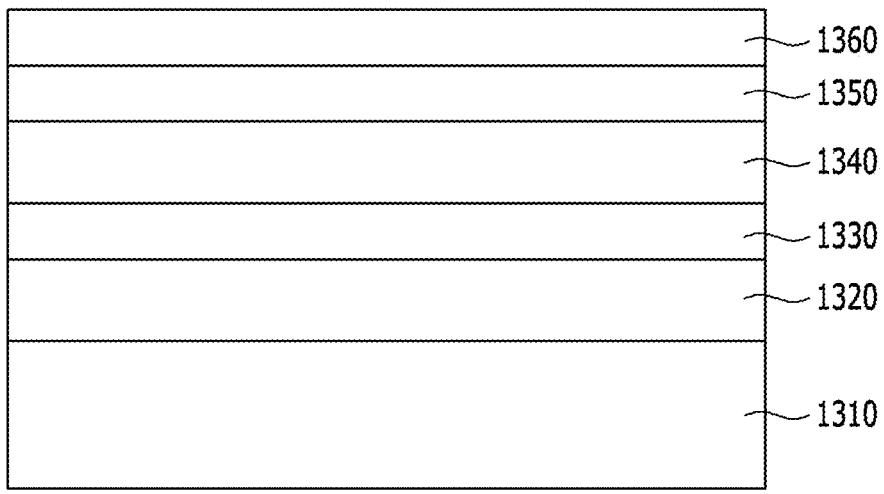
FIG. 13 is a cross-sectional view showing a cross-sectional structure of an embodiment of a touch screen panel including a transparent electrode.

In another exemplary embodiment, the electronic device may be a touch screen panel. The detailed structure of the touch screen panel is known. The schematic structure of the touch screen panel is shown in FIG. 13. Referring to FIG. 13, on a substrate 1310, the touch screen panel may include a first transparent conductive film 1320, a first transparent adhesive film 1330 (e.g., an optical clear adhesive (OCA) film), a second transparent conductive film 1340, a second transparent adhesive film 1350, and a window 1360 for a display device, on a panel for a display device (e.g., an LCD panel). The first transparent conductive film and/or the second transparent conductive film may be the transparent electrode according to an embodiment.

In addition, an example of applying the transparent electrode according to exemplary embodiments to an organic light emitting diode device or a touch screen panel (e.g., a transparent electrode thereof) is illustrated, but a transparent electrode according to exemplary embodiments may be used as an electrode for other electronic devices including a transparent electrode without a particular limit. For example, the transparent electrode according to exemplary embodiments may be applied as a pixel electrode and/or a common electrode for a liquid crystal display (LCD), an anode and/or a cathode for an organic light emitting diode device, or a display electrode for a plasma display device. In addition, the transparent electrode may be used as a functional glass or an anti-static layer.

Hereinafter, the embodiments are illustrated in more detail with reference to examples. These examples, however, are not in any sense to be interpreted as limiting the scope of this disclosure.

EXAMPLE

Reference Example 1

Preparation of Nanowire Dispersion

As a nano-sized conductor, an aqueous dispersion including silver nanowire (provider: Cambrios Co., Ltd., Nanopyxis, Aiden, silver nanowire, weight content: 0.5 weight percent (wt %), silver nanowire average diameter: 20-35 nm, average length: 15-30 um) is prepared. 0.25 wt % of hydroxypropyl methyl cellulose (HPMC) is dissolved in distilled water to provide a binder solution. The silver nanowire solution and the binder solution are mixed, and a mixed solution of water and ethanol (water:ethanol=70 volume:30 volume) is prepared and diluted to provide a nanowire aqueous dispersion having a concentration of nanowire of 0.1 to 0.2 wt %. The adding amount of nanowire and binder is maintained as binder/AgNW=0.05 to 0.1 wt/wt % in a weight ratio.

Reference Examples 2 to 11

Preparation of Composition for Organic/Inorganic Composite Including Inorganic Oxide Nanoparticles and Urethane Acrylate Dispersions (solid content: 3%) including 100 parts by weight of urethane acrylate (manufacturer: Sukgung AT, trade name: SG-P-type), and, as an inorganic oxide nanoparticle, 1 part by weight (Reference Example 2) of silica ($SiO_2$) particles (average particle diameter: 20 nm, manufacturer: Sukgung AT, non-porous), 3 parts by weight (Reference Example 3), 5 parts by weight (Reference Example 4), 10 parts by weight (Reference Example 5), 15 parts by weight (Reference Example 6), 17.5 parts by weight (Reference Example 7), 20 parts by weight (Reference Example 8), 25 parts by weight (Reference Example 9), 35 parts by weight (Reference Example 10), and 50 parts by weight (Reference Example 11) are prepared, respectively. As a dispersion solvent, diacetone alcohol, isopropyl alcohol, or a mixed solution thereof is used.

Reference Example 12

A dispersion (solid content: 3%) including 100 parts by weight of urethane acrylate (manufacturer: Sukgung AT, trade name: SG-P-type), and, as an inorganic oxide nanoparticle, 17.5 parts by weight (Reference Example 9) of silica ($SiO_2$) particles (average particle diameter: 50 nm, manufacturer: Sukgung AT) is prepared. As a dispersion solvent, diacetone alcohol, isopropyl alcohol, or a mixed solution thereof is used.

Transparent Electrode Manufacture

Example 1

[1] The nanowire aqueous dispersion obtained from Reference Example 1 is coated on a polyethylene terephthalate (PET) or polycarbonate (PC) substrate using an automated bar coater (GBC-A4, GIST) and dried by hot air at 90° C. and dried in an oven at 100° C. to provide an electrically conductive layer.

[2] Each dispersion composition obtained from Reference Examples 2 to 9 is coated on an electrically conductive layer using a Mayer bar and dried at 100° C. for 1 minute and then irradiated with a UV lamp (wavelength: 365 nm, light quantity: 800 milliJoules per square centimeter ($mJ/cm^2$)) for 15 seconds to perform cross-linking polymerization among the acrylate to provide a transparent electrode (Example 1 to Example 8) as shown in Table 1.

Figure 3:
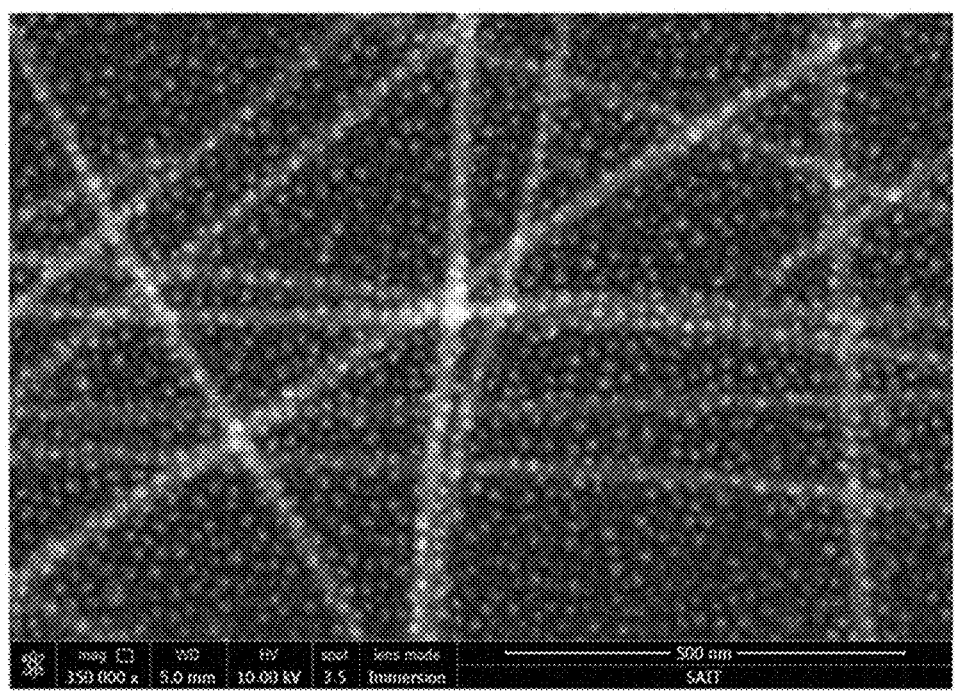
FIG. 3 shows a scanning electron microscope image of the top surface of the transparent electrode manufactured in Example 1.

[3] A scanning electron microscope photograph of the surface on the side of organic composite layer of the transparent electrode (Example 4: silica nanoparticle amount: 10 parts by weight) is shown in FIG. 3. From the results shown in FIG. 3, it is confirmed that silica nanoparticles are uniformly dispersed on the entire organic composite layer.

Figure 4:
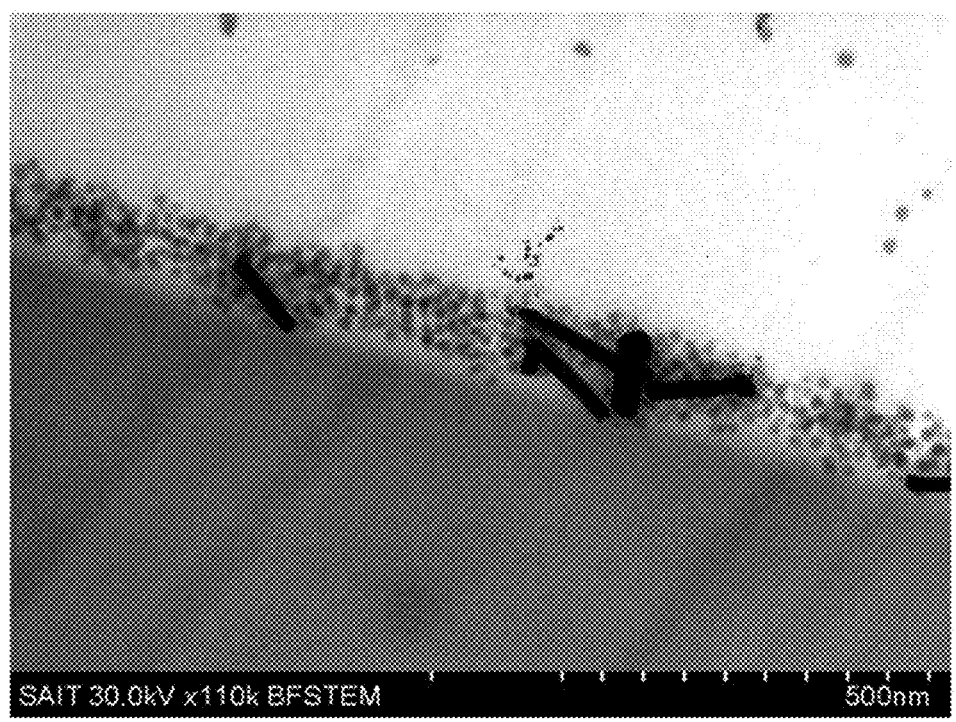
FIG. 4 shows a scanning electron microscope image of the side cross-section of the transparent electrode manufactured in Example 1.

A scanning electron microscope photograph of a cross-sectional surface of a transparent electrode obtained by a microtome method is shown in FIG. 4. From the results shown in FIG. 4, it is confirmed that the integrated structure of the electrically conductive layer and the organic composite layer has a thickness of about 120 nm.

Figure 5:
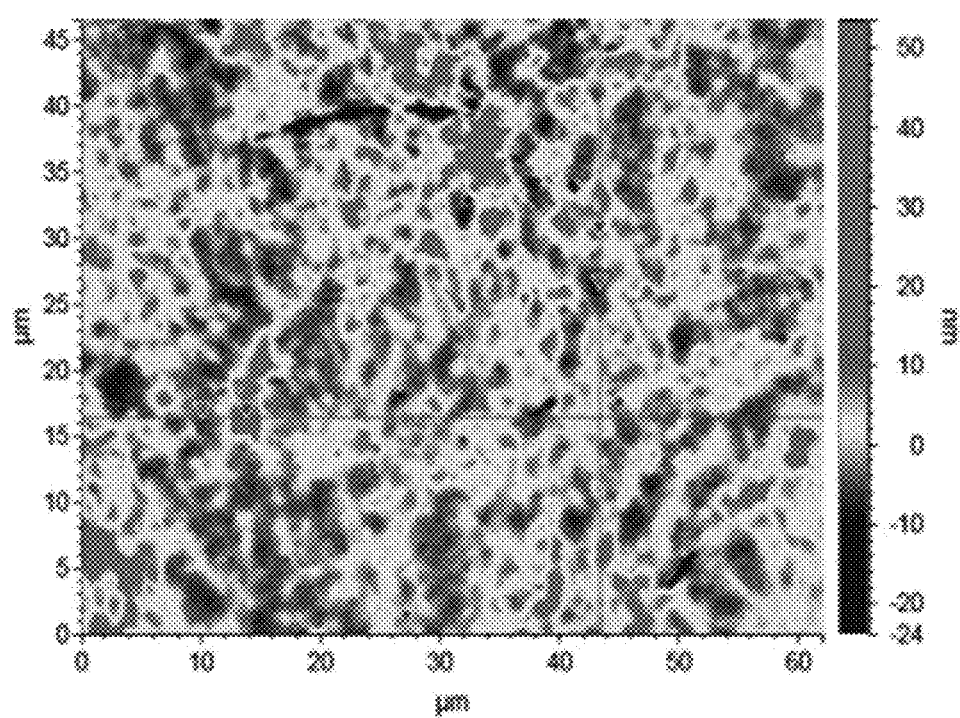
FIG. 5 shows a surface profile image of the organic composite layer of the transparent electrode manufactured in Example 1.

[4] A surface profile image is obtained using a 3D optical microscope (manufacturer: Bruker, Trade name: OM-CONTOUR GT-X), and the results are shown in FIG. 5. Referring to FIG. 5, it is confirmed that the organic composite layer has surface roughness of 4.66 nm.

Comparative Example 1

[1] A transparent electrode is fabricated in accordance with the same procedure as in Example 1, except that a dispersion (solid 3%) including urethane acrylate (manufacturer: Sukgung AT, trade name: SG-P-type) is coated on a conductor layer, instead of the compositions obtained from Reference Examples 2 to 9.

Figure 6:
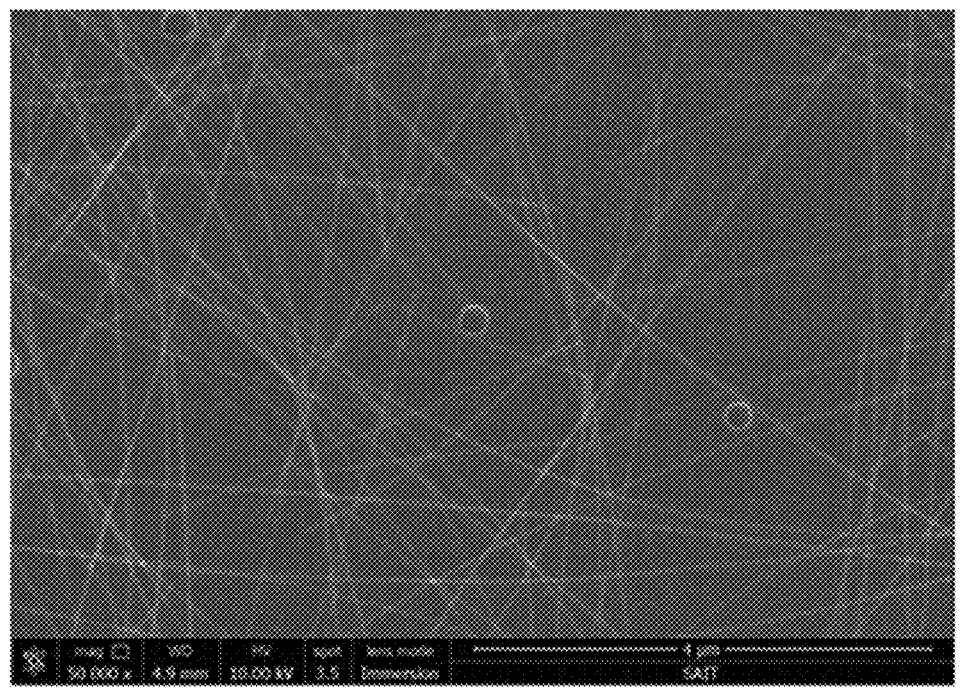
FIG. 6 shows scanning electron microscope image of the top surface of the transparent electrode manufactured in Comparative Example 1.
Figure 7:
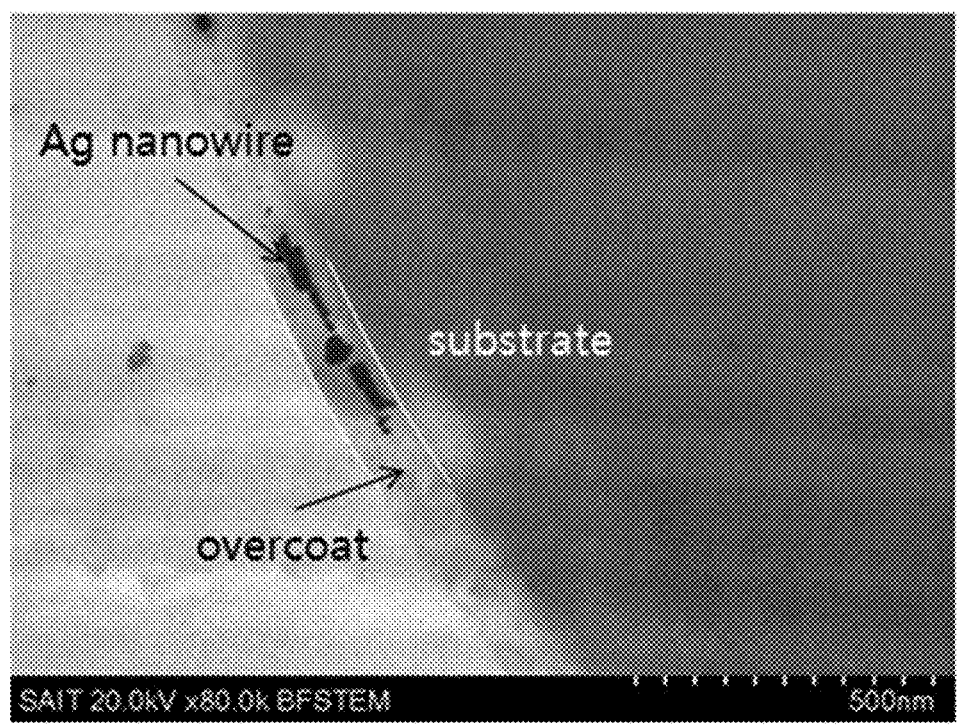
FIG. 7 shows a scanning electron microscope image of the side cross-section of the transparent electrode manufactured in Comparative Example 1.

[2] A scanning electron microscope photograph of the surface of the polymer layer of the obtained transparent electrode is shown in FIG. 6. From the results shown in FIG. 6, it is confirmed that the obtained transparent electrode includes only nanowires without particles. FIG. 7 shows a scanning electron microscope photograph of the cross-sectional surface of a transparent electrode obtained from a microtome method. From the results shown in FIG. 7, it is confirmed that the sum of thicknesses of the electrically conductive layer and the polymer layer is about 120 nm.

Figure 8:
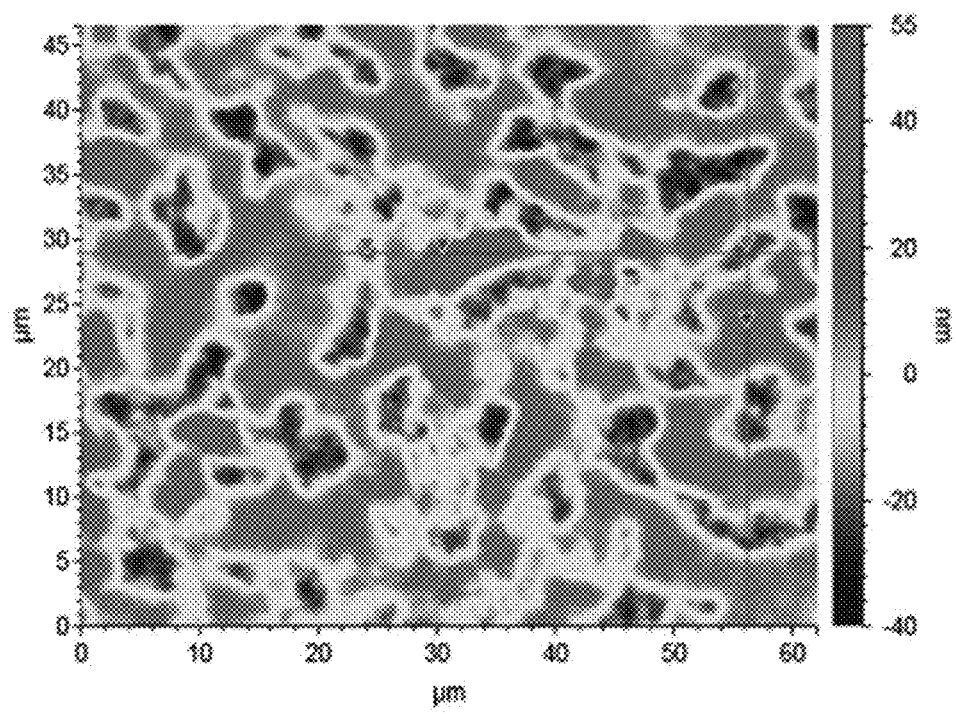
FIG. 8 shows a surface profile image of the organic composite layer of the transparent electrode manufactured in Comparative Example 1.

[3] A surface profile image is obtained using a 3D optical microscope (manufacturer: Bruker, trade name: OM-CONTOUR GT-X), and the results are shown in FIG. 8. From the results shown in FIG. 8, it is confirmed that the organic composite layer has surface roughness of 12.23 nm.

Comparative Example 2

A transparent electrode is manufactured in accordance with the same procedure as in Example 1, except that the dispersion composition obtained from Reference Example 10 (silica nanoparticle amount: 35 parts by weight) is coated on the conductor layer instead of the compositions obtained from Reference Examples 2 to 9.

Comparative Example 3

A transparent electrode is manufactured in accordance with the same procedure as in Example 1, except that the dispersion composition obtained from Reference Example 11 (silica nanoparticle amount: 50 parts by weight) is coated on the conductor layer instead of the compositions obtained from Reference Examples 2 to 8.

Comparative Example 4

A transparent electrode is manufactured in accordance with the same procedure as in Example 1, except that the dispersion composition obtained from Reference Example 12 (silica nanoparticle size: 50 nm) is coated on the conductor layer instead of the composition obtained from Reference Example 2.

Evaluation of Transparent Electrode Characteristics

Experimental Example 1

Evaluation of Optical Properties

Figure 9:
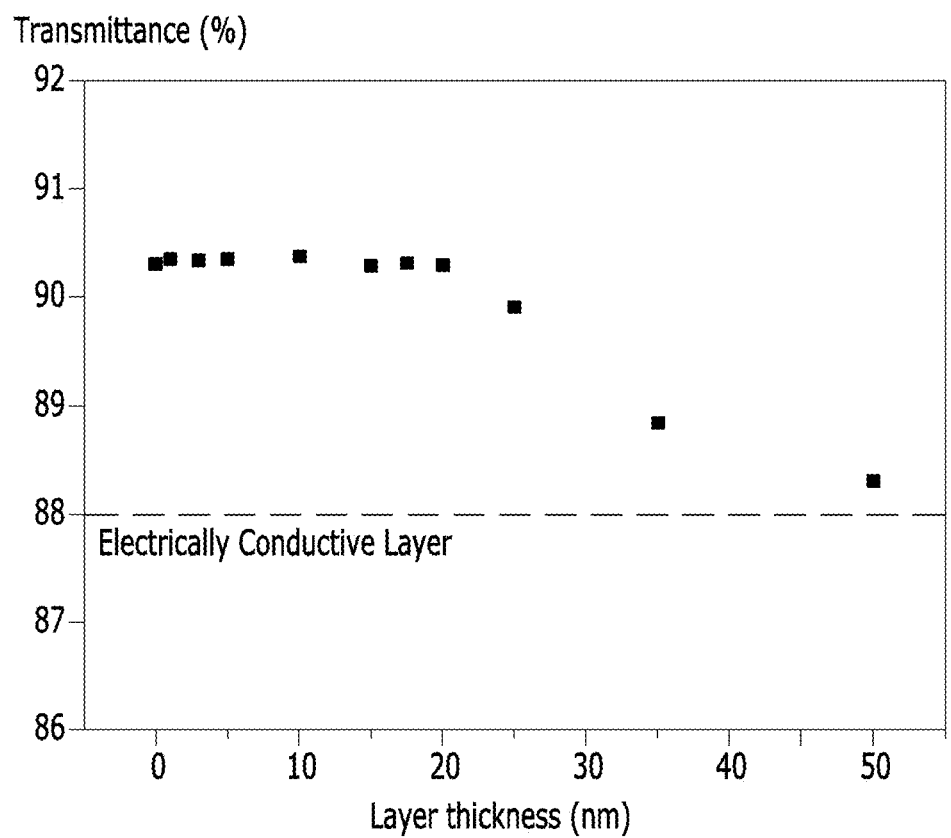
FIG. 9 is a graph of transmittance (percent, %) versus layer thickness (nanometers) showing transmittance variations of transparent electrodes depending on amounts of silica nanoparticles of the organic/inorganic composite layers.
Figure 10:
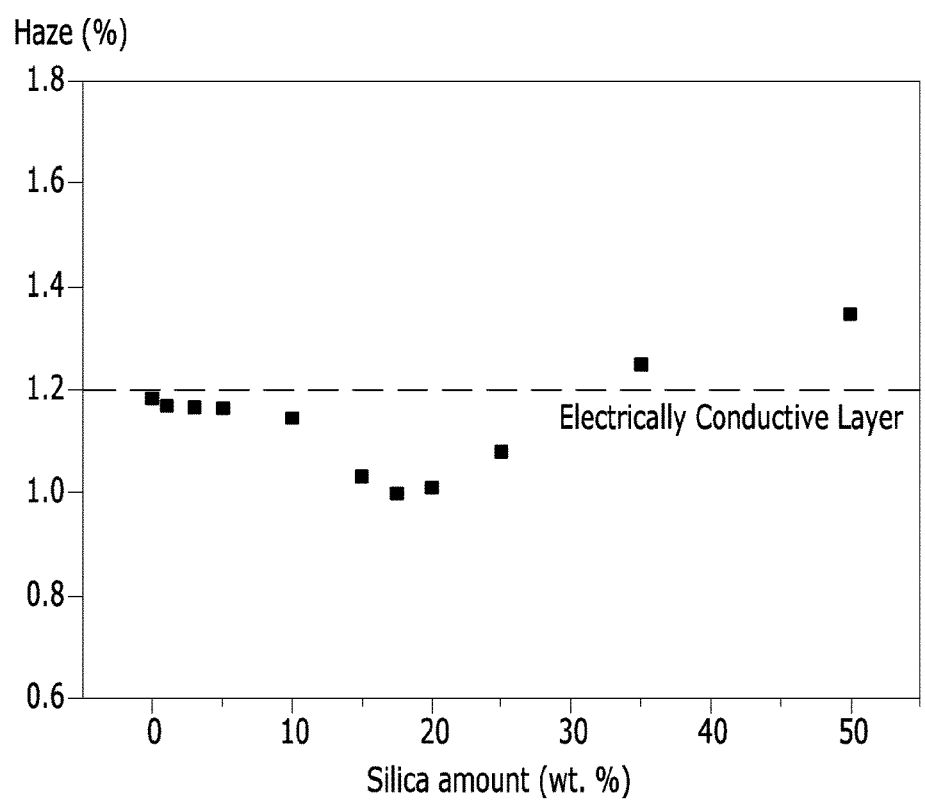
FIG. 10 is a graph of haze (percent) versus silica amount (weight percent, wt %) showing haze variations of transparent electrodes depending on amounts of silica nanoparticles of the organic/inorganic composite layers.

[1] The electrically conductive layer, the transparent electrodes obtained from Examples 1 to 8, and the transparent electrodes obtained from Comparative Examples 1 to 3 are measured for light transmittance and haze, and the results are shown in FIG. 9 and FIG. 10, respectively. From the results shown in FIG. 9 and FIG. 10, it is confirmed that the transparent electrodes obtained from Examples 1 to 8 may improve transmittance more than the electrically conductive layer. In addition, it is confirmed that the transparent electrodes according to the examples may have decreased haze compared to the transparent electrodes obtained from Comparative Examples 1 to 3.

[2] The electrically conductive layer, the transparent electrodes obtained from Comparative Examples 1 to 4, and the transparent electrodes obtained from Examples 1 to 8 are measured for transmittance and haze according to the above methods, and the results are shown in the following Table 1.

TABLE 1

| | Amount of silica (wt %) | Transmittance (%) | Haze (%) |
|---|---|---|---|
| Electrically conductive layer (No overcoat) | 0 | 88.1% | 1.14% |
| Comparative Example 1 | 0 | 90.38 | 1.185 |
| Example 1 | 1 | 90.42 | 1.173 |
| Example 2 | 3 | 90.4 | 1.168 |
| Example 3 | 5 | 90.42 | 1.167 |
| Example 4 | 10 | 90.45 | 1.146 |
| Example 5 | 15 | 90.35 | 1.03 |
| Example 6 | 17.5 | 90.39 | 0.999 |
| Example 7 | 20 | 90.36 | 1.01 |
| Example 8 | 25 | 89.96 | 1.08 |
| Comparative Example 2 | 35 | 88.87 | 1.25 |
| Comparative Example 3 | 50 | 88.31 | 1.35 |
| Comparative Example 4 | 17.5 (silica particle diameter 50 nm) | 89.4 | 25.54 |

From the results shown in Table 1, it is confirmed that the transparent electrodes according to the examples may have significantly improved optical properties compared to the electrically conductive layer or the transparent electrodes according to the Comparative Examples.

Experimental Example 2

Evaluation of Electrical Properties

The obtained electrically conductive layer and the transparent electrodes obtained from Examples 1 to 5 are measured for sheet resistance using an R-Chek, which is a 4 point sheet resistance measurer. It is measured by averaging sheet resistances of A4 sheets with 24 reference points. From the results, it is confirmed that the transparent electrodes obtained from Examples 1 to 5 have sheet resistance of about 30 ohm/sq, and the electrically conductive layer has sheet resistance of about 30 ohm/sq.

Experimental Example 3

Evaluation of Reliability Characteristics

The transparent electrodes according to Comparative Example 1 and Comparative Example 3 and the transparent electrodes according to Examples 1 to 5 are allowed to stand at a temperature of 85° C. and under humidity of 85% for 10 days and then measured for a sheet resistance variation ratio (%) before and after allowing to stand, and the results are shown in the following Table 2.

TABLE 2

| | Amount of silica (wt %) | Resistance variation ratio after 10 days (%) |
|---|---|---|
| Comparative Example 1 | 0 | 6.5 |
| Example 4 | 10 | 2.7 |
| Example 5 | 15 | 0.3 |
| Example 6 | 17.5 | 0.6 |
| Example 7 | 20 | 1.2 |
| Example 8 | 25 | 3.5 |
| Comparative Example 3 | 50 | 20.6 |

From the results shown in Table 2, it is confirmed that the reliability may be significantly improved in the transparent electrodes according to Examples 1 to 5 even under a severe atmosphere compared to the transparent electrodes according to Comparative Examples 1 and 3.

Experimental Example 4

Extraneous Curvature Test (Curvature Radius: 3 mm)

The transparent electrode according to Comparative Example 1 and the transparent electrode according to Example 4 are bent to a curvature radius of 3 mm 200,000 times, and then a resistance variation ratio with respect to the initial sheet resistance is measured. From the results, it is confirmed that the transparent electrode according to Comparative Example 1 has a resistance increase rate of 1.6%; on the other hand, the transparent electrode according to Example 4 has a resistance increase rate of 0.8%.

Experimental Example 5

Figure 11:
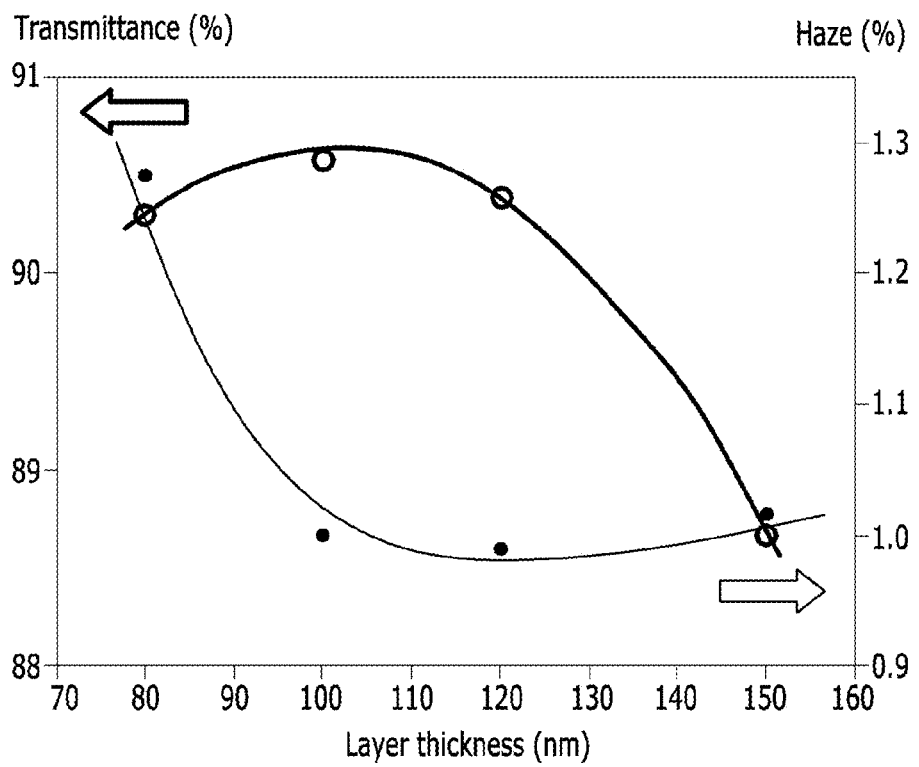
FIG. 11 is graphs of transmittance (percent, %) and haze (%) versus layer thickness (nanometers), respectively, showing transmittance and haze variations depending on thicknesses of electrically conductive layers and organic/inorganic composite layers.

Evaluation of Transmittance and Haze According to Sum of Thicknesses of Electrically Conductive Layer and Organic/Inorganic Composite Layer A transparent electrode is fabricated using a dispersion composition obtained from Reference Example 8 in accordance with the same procedure as in Example 1, except that the coating amount of the dispersion composition is adjusted to provide a sum of thicknesses of the electrically conductive layer and the organic/inorganic composite layer of 80 nm, 100 nm, 120 nm, and 150 nm, respectively. The transparent electrodes having the different thickness are measured for transmittance and haze according to the same method as in Experimental Example 1. The results are shown in FIG. 11. From the results shown in FIG. 11, it is confirmed that the transmittance approaches maximum at around 100 nm. From the results shown in FIG. 11, it is also confirmed that the haze may be increased due to the surface roughness of the nanowire when the thickness of the coating film is too thin.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A transparent electrode comprising
a substrate;
an electrically conductive layer disposed on the substrate and including a plurality of nano-sized conductors; and
an organic/inorganic composite layer directly disposed on the electrically conductive layer and including a cross-linked polymer and nano-sized inorganic oxide particles,
wherein the nano-sized inorganic oxide particles are included in an amount of greater than or equal to about 1 part by weight and less than about 35 parts by weight, relative to 100 parts by weight of the cross-linked polymer.

2. The transparent electrode of claim 1, wherein the electrically conductive layer comprises a discontinuous layer wherein two or more of the nano-sized conductors contact each other to provide an electrical connection.

3. The transparent electrode of claim 1, wherein the nano-sized conductors comprise an electrically conductive metal nanowire, an electrically conductive nanosheet, an electrically conductive metal nanomesh, an electrically conductive carbon nanotube, or a combination thereof.

4. The transparent electrode of claim 1, wherein the electrically conductive layer comprises an organic binder, which binds the plurality of nano-sized conductors to one another.

5. The transparent electrode of claim 1, wherein the nano-sized inorganic oxide particles have a size of less than about 50 nanometers.

6. The transparent electrode of claim 1, wherein the nano-sized inorganic oxide particles comprise $SiO_2$, $Al_2O_3$, $TiO_2$, $ZnO$, $ZrO_2$, $Y_2O_3$, or a combination thereof.

7. The transparent electrode of claim 1, wherein the cross-linked polymer comprises an acrylate cross-linking bond.

8. The transparent electrode of claim 1, wherein the cross-linked polymer comprises a cross-linking polymerization product of urethane (meth)acrylate, a perfluoropolymer including a (meth)acrylate group, a poly(meth)acrylate including a (meth)acrylate group, an epoxy(meth)acrylate, or a combination thereof.

9. The transparent electrode of claim 1, wherein at least a portion of the nano-sized inorganic oxide particles is dispersed in a matrix of the cross-linked polymer.

10. The transparent electrode of claim 1, wherein the electrically conductive layer and the organic/inorganic composite layer provide an integrated structure.

11. The transparent electrode of claim 10, wherein at least a portion of the nano-sized inorganic oxide particles is disposed between adjacent nano-sized conductors of the plurality of nano-sized conductors.

12. The transparent electrode of claim 1, wherein a sum of thicknesses of the electrically conductive layer and the organic/inorganic composite layer is greater than about 80 nanometers and less than about 150 nanometers.

13. The transparent electrode of claim 1, wherein the nano-sized inorganic oxide particles are included in an amount of greater than or equal to about 10 parts by weight and less than or equal to about 25 parts by weight, relative to 100 parts by weight of the cross-linked polymer.

14. The transparent electrode of claim 1, wherein the organic/inorganic composite layer has surface roughness of less than or equal to about 5 nanometers.

15. The transparent electrode of claim 1, wherein the transparent electrode has haze of less than or equal to about 1 percent and transmittance of greater than or equal to about 88 percent for light having a wavelength of 550 nanometers.

16. The transparent electrode of claim 1, wherein the transparent electrode has sheet resistance of less than or equal to about 30 ohms per square.

17. An electronic device comprising the transparent electrode of claim 1.

18. The electronic device of claim 17, wherein the electronic device is a display, a touch screen panel, a solar cell, an e-window, an electrochromic mirror, a transparent heater, a heat mirror, a transparent transistor, a transparent strain sensor, or a flexible display.

* * * * *